Figure 3:
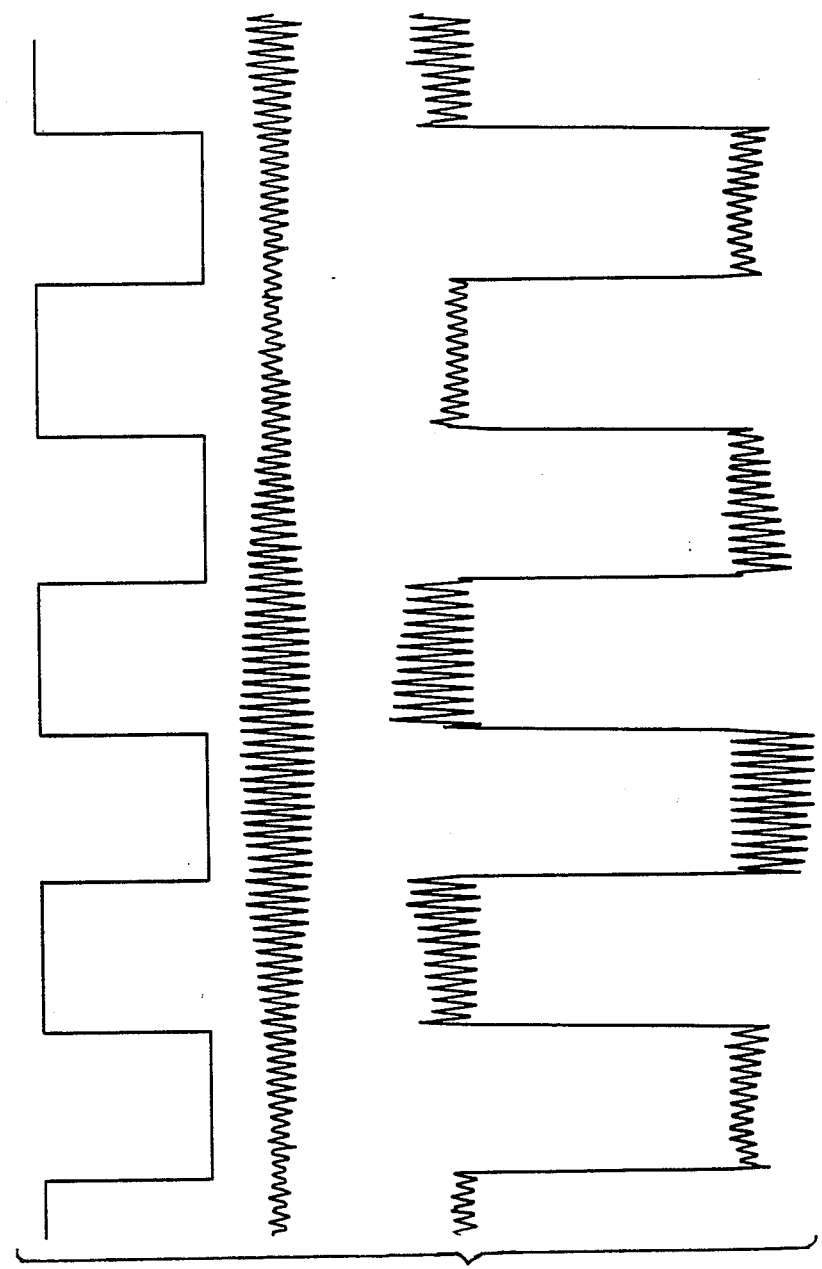

United States Patent [19]

Floweredew et al.

[11] Patent Number: 4,896,117
[45] Date of Patent: Jan. 23, 1990

[54] METHOD OF AND APPARATUS FOR TRACING FAULTS IN ELECTRICAL CONDUCTORS

[75] Inventors: Peter M. Floweredew, Bristol; Andrzej Z. Regini, Eastington, both of England

[73] Assignee: Radiodetection Limited, Bristol, England

[21] Appl. No.: 267,162

[22] Filed: Oct. 24, 1988

[30] Foreign Application Priority Data

Oct. 24, 1987 [GB] United Kingdom ................. 8724960

[51] Int. Cl.⁴ ............................................. G01R 31/08
[52] U.S. Cl. .................... 324/520; 324/527; 324/544; 324/557; 324/326
[58] Field of Search ............... 324/509, 512, 513, 515, 324/520, 521, 527, 528, 529, 530, 67, 326, 329, 557, 559; 379/26; 455/67

[56] References Cited

U.S. PATENT DOCUMENTS

| | | | |
|---|---|---|---|
| 3,299,351 | 1/1967 | Williams | 324/520 |
| 4,118,662 | 10/1978 | Weber | 324/67 X |
| 4,686,454 | 8/1987 | Pecukonis | 324/326 |

Primary Examiner—Reinhard J. Eisenzopf
Assistant Examiner—Robert W. Mueller
Attorney, Agent, or Firm—Young & Thompson

[57] ABSTRACT

A high frequency and two low frequency electromagnetic signals are generated (1), the low ones being coherent with the second being a sub-harmonic of the first. The high frequency is modulated (4) by the second low frequency and applied (7,9) as a composite signal to an underground conductor, while the first low frequency is applied (9,10) additively. A receiver traversed over the line has aerials (12,21) or ground probes (24,25) for picking up these signals in separate channels. The high frequency is demodulated (18) to provide a reference signal for a synchronous detector (20) to which the first low frequency is fed. That suffers a phase reversal if there is a fault, and the output of the synchronous detector is arranged to indicate that.

13 Claims, 2 Drawing Sheets

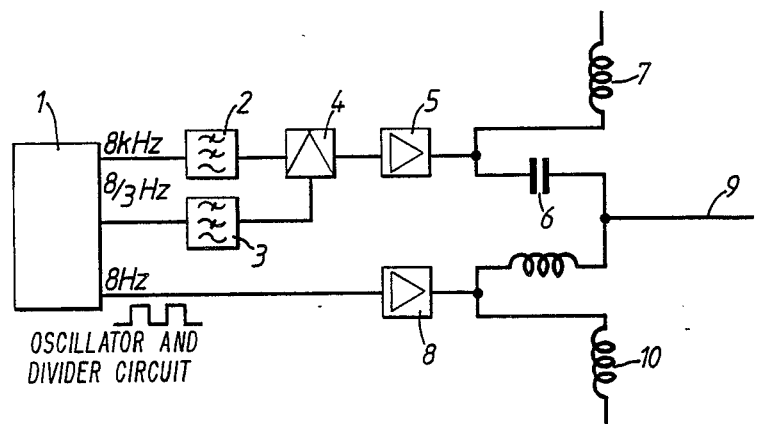
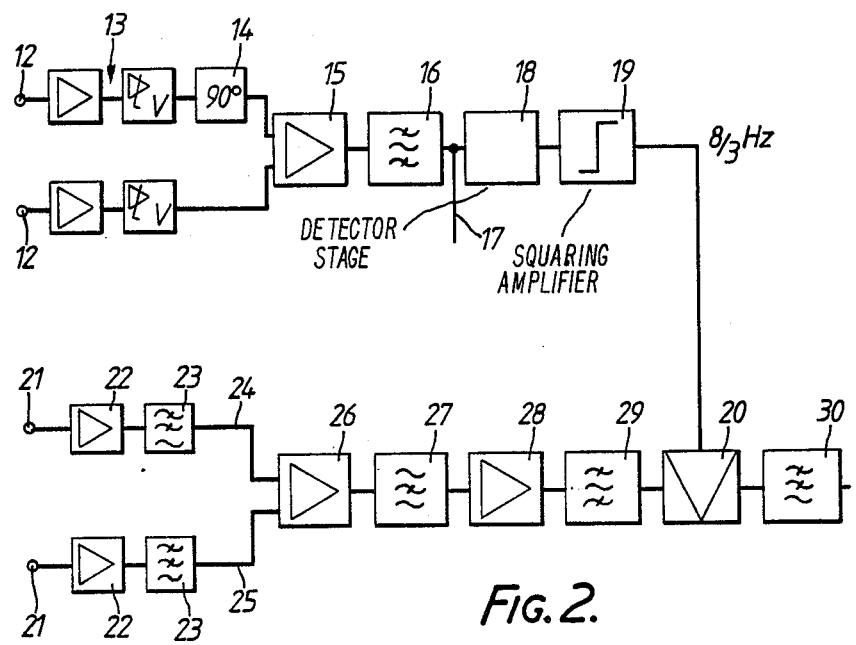

METHOD OF AND APPARATUS FOR TRACING FAULTS IN ELECTRICAL CONDUCTORS

This invention relates to cable fault tracing systems. It is concerned particularly with the detection of faults in underground electric cables where the insulation has broken down, giving rise to a leakage path to earth. The problem has been described and a solution offered in U.S. Pat. No. 3,991,363, among others.

The technique of that U.S patent involves the application of low and high frequency signals simultaneously to the line. The main point of doing this is to exploit the differing transmission/detection capabilities of low and high frequencies. Low frequencies have low inductive and capacitive coupling effects, and so tend to travel much further along a line than high frequencies, whose capacitive coupling to ground presents a significant leakage path. However, the low inductive coupling of low frequencies makes them harder to detect by conventional aerial/receiver techniques, while the high frequencies enable increased receiver sensitivity to offset the rate of signal loss.

It should also be mentioned that the injected signal can also be used to locate the buried cable and trace its route.

The introduction to U.S. Pat. No. 3,991,363 describes the basic prior art of fault location by injecting an A.C. signal into the line, and measuring the voltage gradient in the earth return path across a pair of probes traversed along its route. There is a phase reversal detectable when the fault is passed, and it is this phase reversal which assists location of the null point over the fault. Detection of relative phase therefore requires appropriate synchronising and timing techniques relative to the applied signal frequency.

The particular form adopted in U.S. Pat. No. 3,991,363 is a high frequency signal modulated by the low frequency signal, so that it appears on the line as intermittent pulses of high frequency as shown in FIG. 2 of the specification, e.g. 100 kHz pulses every time the 11 Hz signal is high. These high frequency pulses are detected much more easily than the 11 Hz, and can be used to give a reference to the timing of the low frequency signal, to enable phase measurements to be made.

It is therefore acknowledged that composite signal prior art exists. However, there are certain problems and drawbacks, and in particular:

(a) The injection means has to apply a composite signal of the two frequencies, and so the transmitter must be designed to handle the characteristics of both.

(b) The high frequency content of the signal, which is vital for effective location of the line, is only present for 50% of the time, and is therefore more likely to suffer loss of detectability at a distance against background noise than one which is present all the time.

It is the aim of this invention to improve on such a system.

According to one aspect of the present invention there is provided a method of tracing faults in at least partially hidden or inaccessible electrical conductors, comprising generating first and second low frequency phase coherent electromagnetic signals and a high frequency electromagnetic signal, modulating the high frequency signal by the second low frequency signal, additively coupling the modulated high frequency signal and the first low frequency signal to the conductor, traversing a receiver over the assumed or known path of the conductor, separately detecting from the receiver the low and high frequencies, deriving from the latter the low frequency modulation of the high frequency signal and a first low frequency gradient signal, comparing that second low frequency with the gradient signal, and repeating such comparison at different positions of the traverse, substantial changes in result indicating the location of a fault.

Preferably, the second frequency is a sub-harmonic of the first low frequency and the third sub-harmonic is thought likely to give the best results, in particular better selective filtering of the low frequency signal than would be the case if the fundamental were used.

The modulation of the high frequency signal may be amplitude modulation or phase or frequency modulation. The latter has a certain advantage in that it facilitates the simultaneous performance of fault location and route tracing, together with depth measurement.

One advantage of this system is the ease of signal application. When a modulated LF composite signal is applied as in the U.S. patent, the signal transmitter has to be designed primarily to apply the low frequency, which can only be done by direct connection to the line to be tested, and to incorporate the modulation system. In the present system, the signal requirements are advantageously separated, so that simple switching means of relatively high power can be used to produce the first low frequency signal, while the high frequency composite signal can be derived from a signal generator of the type, size and performance already used in conventional location work.

The two signals can be coupled independently to the line to be tested, either by direct connection or by inductive means. For the latter, higher frequencies are always coupled more easily than low. The inductive coupling means can provide non-intrusive application of the signal, as no electrical connection is required. This in turn permits and assists the testing of long lines by repeated application of the induced signal as the received signal decays. It should be noted that, while a higher frequency is more easily coupled by induction, its rate of loss along a line will also be higher than for a low frequency, primarily because of higher leakage to ground by capacitive coupling. So it may therefore be appropriate, for instance, to connect the low frequency by direct electrical connection, when it will travel a long way, but couple the high frequency by induction, repeating the application of that at intervals while the low frequency coupling remains unaltered.

The separation of the signals also allows for inductive reception of them by aerials optimised to the vastly different frequencies. This may permit location of faults under paved areas where connection of probes to the soil is quite impracticable.

According to another aspect of the present invention there is provided apparatus for carrying out such a method.

For a better understanding of the invention, one embodiment will now be described, by way of example, with reference to the accompanying drawings, in which:

FIG. 1 is a block diagram of a transmitter for producing signals in a conductor from which faults can be determined, FIG. 2 is a block diagram of a receiver for detecting and interpreting such signals when traversed along the conductor, and FIG. 3 is a wave form diagram illustrating the transmitted signals.

The transmitter has an oscillator and divider circuit 1 which produces three frequencies. One is a high frequency, 8 kHz in this example, and the other two are low frequencies which are phase coherent, one being a harmonic of the other. The first low frequency is a square wave, of 8 Hz in this example, and being shown as the first wave form in FIG. 3, while the other is lower and sinusoidal, here 8/3 Hz. After passing through respective filters 2 and 3 the high frequency is modulated by the second low frequency in modulator 4, and this is illustrated by the second wave form in FIG. 3. It is shown as amplitude modulation for clarity, but phase or frequency modulation may be preferred, as mentioned above. After amplification in stage 5 this wave form can be applied to a conductor (not shown) which is to be tested for faults. The coupling may be directly through a capacitor 6, or by inductive coupling means 7.

The first low frequency (the square wave) is amplified in stage 8 and may be applied directly to the conductor at 9 or through inductive coupling 10.

The resultant wave form carried by the conductor is shown at the bottom of FIG. 3, being a composite signal from the original three frequencies, the square wave being added to the modulated high frequency.

Referring now to FIG. 2, the receiver has separate channels for picking up or detecting the high and low frequencies. For the high frequency, there are orthogonal aerials 11 and 12 feeding respective preamplifiers and automatic gain control (AGC) amplifiers, collectively indicated by 13. The output of one of these is phase shifted by 90 degrees in stage 14 and the outputs are combined in a summing amplifier 15. A filter 16 passes the 8 KHz signal and this can be used in known fashion to locate the conductor. This is indicated by branch 17, which will go to an indicator showing the proximity of the receiver to the conductor.

For the fault location aspect, the filtered high frequency has its envelope detected in stage 18, and this is squared in amplifier 19, producing a 8/3 Hz reference signal to an input of a synchronous detector 20. This third sub-harmonic is used to allow a separate locator, with accurately tuned filters, to be used with this equipment if desired.

The first low frequency signal, the 8 Hz square wave, may also be detected by aerials, this time in parallel and indicated at 21. The signals they receive would be amplified and directed through low pass filters in stages 22 and 23. This would constitute an inductive pick-up. However, it may be equally or more effective simply to use ground probes 24 and 25 to sense the ground potential produced by current flow. They would be spiked into the ground at a set distance apart along the conductor, and when the next stage was to be checked, one probe could be shifted beyond the other by the same amount, and so on along the conductor in a leap-frogging manner.

The outputs of the probes or of the inductive pick-ups are applied to a differential amplifier 26, which produces a gradient signal, and thence to a filtering stage to reject interfering frequencies. The first filter 27 rejects mains frequency and after amplifier 28 the second filter 29 improves band definition. Its output is a measure of ground current flow. The gradient or direction of this current changes either side of a fault and so the phase of the signal at the output of the filter 29 changes by 180 as the probes move from one side of the fault to the the other. This phase change is detected by the synchronous detector 20 using the third harmonic low frequency reference signal obtained from the demodulated 8 Hz carrier signal. After low pass filter 30 the output signal passes to fault indicating means (not shown).

We claim:

1. A method of tracing faults in an at least partially hidden or inaccessible electrical conductor, whose path is known or which can be assumed, comprising generating first and second low frequency phase coherent electromagnetic signals and a high frequency electromagnetic signal, modulating the high frequency signal by the second low frequency signal, additively coupling the modulated high frequency signal and the first low frequency signal to the conductor, traversing an electromagnetic signal receiver over the assumed or known path of the conductor, separately detecting from the receiver the low and high frequencies, deriving from the received high frequencies the second low frequency modulation of the high frequency signal and deriving from the received low frequencies a first low frequency gradient signal, comparing the second low frequency with the gradient signal and repeating such comparison at different positions of the traverse, substantial changes in result indicating the location of a fault.

2. A method as claimed in claim 1, wherein the second low frequency is a sub-harmonic of the first low frequency.

3. A method as claimed in claim 2, wherein the second low frequency is the third sub-harmonic of the first low frequency.

4. A method as claimed in claim 1, wherein the high frequency signal is frequency modulated by the second low frequency signal.

5. A method as claimed in claim 1, wherein the coupling of the low frequency signal to the conductor is by direct connection and the coupling of the high frequency signal is by induction.

6. A method as claimed in claim 5, wherein the high frequency coupling is applied successively at intervals along the conductor while the low frequency coupling remains unaltered.

7. A method as claimed in claim 1, wherein the gradient signal is obtained from aerials or ground probes at separate points along the conductor.

8. A method as claimed in claim 1, wherein the detected second low frequency provides a reference signal for synchronous demodulation of the gradient signal.

9. Apparatus for tracing faults in an at least partially hidden or inaccessible electrical conductor, whose path is known or which can be assumed, comprising means for generating first and second low frequency phase coherent electromagnetic signals and a high frequency signal, means for modulating the high frequency signal by the second low frequency signal, and means for additively coupling the modulated high frequency signal and the first low frequency signal to the conductor; and further comprising a receiver traversable over the assumed or known path of the conductor, the receiver including means for separately detecting the low and high frequencies, means for demodulating the high frequency to obtain the second low frequency, means for producing a first low frequency gradient signal, means for comparing the second low frequency with the gradient signal, and means for indicating the result of that comparison.

10. Apparatus as claimed in claim 9, wherein the modulating means is a frequency modulator.

11. Apparatus as claimed in claim 9, wherein the coupling means includes means for making a direct connection to the conductor for the first low frequency signal and means for making an inductive coupling to the conductor for the modulated high frequency signal.

12. Apparatus as claimed in claim 9, wherein the receiver has aerials or ground probes for detecting low frequency at different points along the conductor, and means for differencing the detected frequencies, to provide the gradient signal.

13. Apparatus as claimed in claim 9, wherein the comparing means is a synchronous detector with a reference input for the second low frequency.

* * * * *